(12) United States Patent
Upton

(10) Patent No.: US 6,690,310 B1
(45) Date of Patent: Feb. 10, 2004

(54) METHOD AND APPARATUS FOR ADAPTIVELY COMPENSATING FOR AN INACCURACY IN AN ANALOG-TO-DIGITAL CONVERTER

(75) Inventor: Eric L. Upton, Bellevue, WA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/366,234

(22) Filed: Feb. 13, 2003

(51) Int. Cl.[7] ................................................ H03M 1/06
(52) U.S. Cl. ....................................... 341/118; 341/120
(58) Field of Search ................................. 341/118, 120, 341/121, 143, 155, 159

(56) References Cited

U.S. PATENT DOCUMENTS 5,319,370 A * 6/1994 Signore et al. ............. 341/120

6,373,423 B1 * 4/2002 Knudsen ..................... 341/159

* cited by examiner

*Primary Examiner*—Brian Young
*Assistant Examiner*—Joseph Lauture
(74) *Attorney, Agent, or Firm*—Posz & Bethards, PLC

(57) ABSTRACT

In an analog-to-digital converter (100), a method and apparatus compare (302) an analog input signal (102) with a reference signal (108) to generate a decision signal (110), and sum (304) the analog input signal with a control value (130) whose magnitude is determined by an accumulated value (126), and whose sign is determined by the decision signal, thereby generating an error signal (114). The method and apparatus further calculate (306) a correlation value (118) between the error signal and the decision signal, and accumulate (308) the correlation value to produce the accumulated value, thereby adaptively compensating for an inaccuracy in the A/D converter.

18 Claims, 3 Drawing Sheets

METHOD AND APPARATUS FOR ADAPTIVELY COMPENSATING FOR AN INACCURACY IN AN ANALOG-TO-DIGITAL CONVERTER

FIELD OF THE INVENTION

This invention relates in general to communication systems, and more specifically to a method and apparatus for adaptively compensating for an inaccuracy in an analog-to-digital converter.

BACKGROUND OF THE INVENTION

To reduce hardware expense and power consumption, a recent trend in communication receiver implementation has been to move the analog-to-digital (A/D) converter closer to the antenna. Communication systems, such as global positioning satellite (GPS) systems and cellular telephone systems, utilize multiple carriers within a single band. Receivers for such systems require high-performance A/D conversion, because high linearity is necessary to convert the multiple carriers. Without high linearity, self-interference is generated through cross product terms.

Unfortunately, the quantizers utilized in prior-art A/D converters have introduced gains and offsets that are not stable over time and temperature. These unstable gains and offsets have created unacceptable inaccuracy and non-linearity that render the prior-art A/D converters unusable for multiple-carrier conversion.

Thus, what is needed is a method and apparatus for adaptively compensating for an inaccuracy in an analog-to-digital converter. Preferably, the method and apparatus will provide quantizer gains and offsets that are sufficiently stable over time and temperature to produce the accuracy and linearity required for multiple-carrier A/D conversion.

SUMMARY OF THE INVENTION

An object of the present invention is to provide a method for adaptively compensating for an inaccuracy in an analog-to-digital converter. The method comprises comparing an analog input signal with a reference signal to generate a decision signal, and summing the analog input signal with a control value whose magnitude is determined by an accumulated value, and whose sign is determined by the decision signal, thereby generating an error signal. The method further comprises calculating a correlation value between the error signal and the decision signal, and accumulating the correlation value to produce the accumulated value, thereby adaptively compensating the inaccuracy.

Another object of the present invention is to provide an apparatus for adaptively compensating for an inaccuracy in an analog-to-digital converter. The apparatus comprises a comparator, coupled to an analog input signal and coupled to a reference signal for comparing the analog input signal with the reference signal to generate a decision signal. The apparatus further comprises a sign determiner, coupled to the comparator and coupled to an accumulator, for generating a control value whose magnitude is an accumulated value, and whose sign is determined by the decision signal. The apparatus also includes a summer coupled to the analog input signal and coupled to the sign determiner for summing the analog input signal with the control value, thereby generating an error signal, and a correlative multiplier coupled to the summer and coupled to the comparator for calculating a correlation value between the error signal and the decision signal. In addition, the apparatus includes the accumulator coupled to the correlative multiplier for accumulating the correlation value to produce the accumulated value, thereby adaptively compensating the inaccuracy.

A third object of the present invention is to provide an integrated circuit for adaptively compensating for an inaccuracy in an analog-to-digital converter. The integrated circuit comprises a comparator, intended to be coupled to an analog input signal and coupled to a reference signal for comparing the analog input signal with the reference signal to generate a decision signal. The integrated circuit further comprises a sign determiner, coupled to the comparator and coupled to an accumulator, for generating a control value whose magnitude is an accumulated value, and whose sign is determined by the decision signal. The integrated circuit also includes a summer intended to be coupled to the analog input signal and coupled to the sign determiner for summing the analog input signal with the control value, thereby generating an error signal, and a correlative multiplier coupled to the summer and coupled to the comparator for calculating a correlation value between the error signal and the decision signal. In addition, the integrated circuit includes the accumulator coupled to the correlative multiplier for accumulating the correlation value to produce the accumulated value, thereby adaptively compensating the inaccuracy.

Additional objects, advantages, and features of the present invention will become apparent from the following description and appended claims, taken in conjunction with the accompanying drawings.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF THE PREFERRED EMBODIMENTS

In overview form the present disclosure concerns analog-to-digital converters for communication systems. More particularly, various inventive concepts and principles embodied as a method and apparatus for adaptively compensating for an inaccuracy in an analog-to-digital converter will be discussed and disclosed. The communications systems of particular interest are those being deployed and developed for multi-carrier communications operating above one gigahertz, although the concepts and principles have application in other systems and devices.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit the invention in any manner. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in one or more conventional digital signal processors (DSPs), or with integrated circuits (ICs) such as custom or application-specific ICs. It is expected that one of ordinary skill, notwithstanding possibly significant effort and many design choices motivated by, for example, available time, current technology, and economic considerations, when guided by the concepts and principles disclosed herein will be readily capable of programming such DSPs, or generating such ICs with minimal experimentation. Therefore, in the interest of brevity and minimization of any risk of obscuring the principles and concepts according to the present invention, further discussion of such DSPs and ICs, if any, will be limited to the essentials with respect to the principles and concepts employed by the preferred embodiments.

Figure 1:
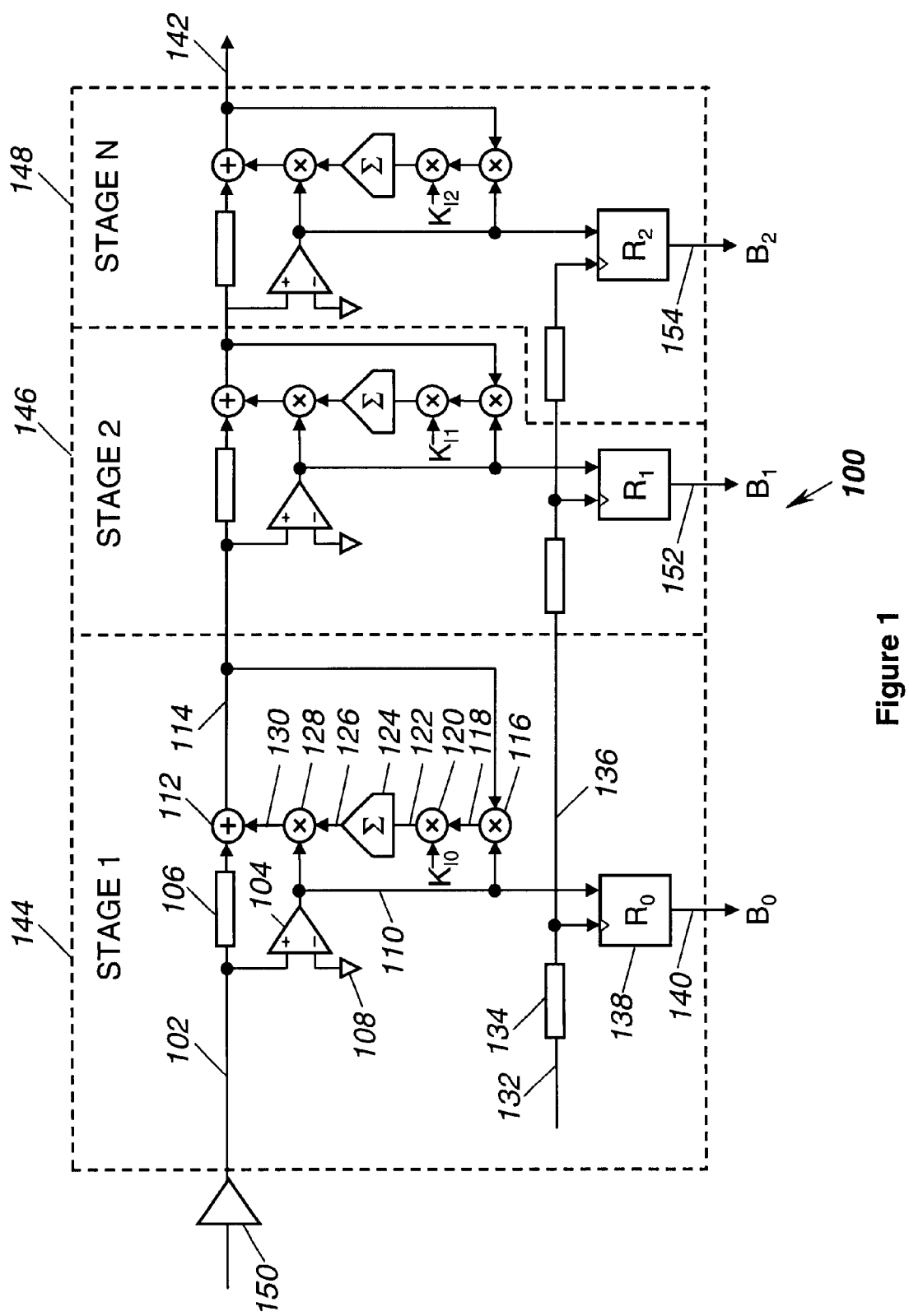
FIG. 1 is an electrical block diagram of an exemplary pipelined A/D converter.

Referring to FIG. 1, an electrical block diagram depicts an exemplary pipelined A/D converter 100 in accordance with the present invention, including a first stage 144 including a comparator 104, coupled to an analog input signal 102 from an amplifier 150 (optional), and further coupled to a reference signal 108 for comparing the analog input signal 102 with the reference signal 108 to generate a decision signal 110. The first stage 144 further includes a sign determiner 128, coupled to the comparator 104 and coupled to an accumulator 124, for generating a control value 130 whose magnitude is an accumulated value 126, and whose sign is determined by the decision signal 110. The first stage 144 also includes a summer 112 coupled through an analog path delay element 106 to the analog input signal 102 and coupled to the sign determiner 128 for summing the analog input signal 102 with the control value 130, thereby generating an error signal 114 that will be passed on to a next stage of the A/D converter 100.

Also in the first stage 144 of the A/D converter 100, a correlative multiplier 116 is coupled to the summer 112 and to the comparator 104 for calculating a correlation value 118 between the error signal 114 and the decision signal 110. In addition, the accumulator 124 is coupled to the correlative multiplier 116 through a loop gain modifier 120 for accumulating a gain-modified correlation value 122 to produce the accumulated value 126, thereby adaptively compensating inaccuracies in the AND converter 100 caused, for example, by instability in gain and offset over time and temperature.

The first stage 144 further includes a digital path delay element 134 coupled to a sample clock signal 132, and further coupled to a register 138 for recording a digital output associated with the first stage 144. The digital path delay element 134 generates a delayed sample clock signal 136 that is passed on to a subsequent stage of the A/D converter 100. The register 138 is further coupled to the decision signal 110, and has an output 140 for presenting the digital output of the first stage 144. The digital path delay element 134 and the analog path delay element 106 are matched, such that the error signal 114 has had time to settle before being processed by a subsequent stage of the A/D converter 100.

Subsequent stages 146, 148 after the first stage 144, which include outputs 152, 154, are very similar to the first stage 144, and therefore the structure and operation will not be discussed in detail. It should be noted that the subsequent stage 148 is identified as stage N to indicate that any number of stages may be included in the AND converter 100 depending upon the particular application. The essential difference between the subsequent stages 146, 148 and the first stage 144 is that the gains of the respective loop gain modifiers 120, 120', 120" decrease geometrically, preferably by a factor of two per stage, in successive stages of decreasing bit significance. For example, in the three-stage A/D converter 100, the gain of the loop gain modifier 120' in the subsequent (second) stage 146 is one-half the gain of the loop gain modifier 120 of the first stage, and the gain of the loop gain modifier 120" in the subsequent (third) stage 148 is one-half the gain of the second stage loop gain modifier 120'.

Operation of the A/D converter 100 is as follows. An adaptive least mean square (LMS) correction loop is formed by the correlative multiplier 116, the loop gain modifier 120, the accumulator 124, the sign determiner 128, and the summer 112. This correction loop compensates the errors produced at the collective output 142 of the pipeline which, ideally, should converge to a near zero residue value. The bit patterns of each pipeline stage are correlated against each stage's residue, and the resulting partial error term is integrated in the accumulator 124 to produce the accumulated value 126 that then becomes the compensated quantizer step value. In effect, the adjustments made in the accumulator 124 whenever the decision signal 110 and the error signal 114 correlate, tend, over time, to move the error signal towards the optimum average value of zero. Simulations have demonstrated that an 8-bit quantizer in accordance with the present invention advantageously can achieve accuracies better than ¼ least significant bit (LSB).

The A/D converter 100 can be implemented for use at frequencies below 1 GHz through conventional discrete devices. Suitable examples, all available from Analog Devices, Inc. of Norwood MA, are: for the comparator 104, the AD8561 comparator; for the sign determiner 128 and the correlative multiplier 116, the ADG436 two-quadrant multiplier; for the accumulator 124, the AD8138 differential amplifier having an external RC network in a well-known integrator configuration; and for the gain modifier 120, the AD8138 differential amplifier having its gain adjusted by a conventional two-resistor configuration. In addition, the summer 112 can be realized by a conventional resistor network coupled to each summed input and to the summer output and having a common summing node. The delay elements 106, 134 can be, for example, conventional discrete transmission delay lines.

While implementing the A/D converter 100 as described in the immediately preceding paragraph is certainly possible, at higher operating frequencies, e.g., 40 GHz and above, the A/D converter 100 is preferably enabled to higher performance levels by implementation preferably as an indium phosphide (InP) integrated circuit (IC), or, alternatively, as a gallium arsenide (GaAs) IC. Such higher-speed technologies advantageously allow the use of shorter delay lines, e.g., 25 picoseconds or 0.25 mm in InP technology, that can be put directly on-chip along with all the other active and passive components.

An advantage of the pipeline A/D converter 100 is that it will support a very high conversion rate because there is no feedback path to delay the conversion process. Another advantage is its low component count. A ten-bit A/D converter, for example, would require only ten comparators such as the comparator 104, ten accumulators such as the accumulator 124, et cetera. This compares with a ten-bit sigma-delta parallel converter in accordance with the present invention, which, for example, would require 1023 comparators, 1023 accumulators, et cetera. In addition, the pipeline A/D converter 100 advantageously can lend itself to signal amplitude companding to obtain higher peak-to-average power ratios due to its ability to converge the cascaded single-bit quantizers to non-linear gain distributions.

Figure 2:
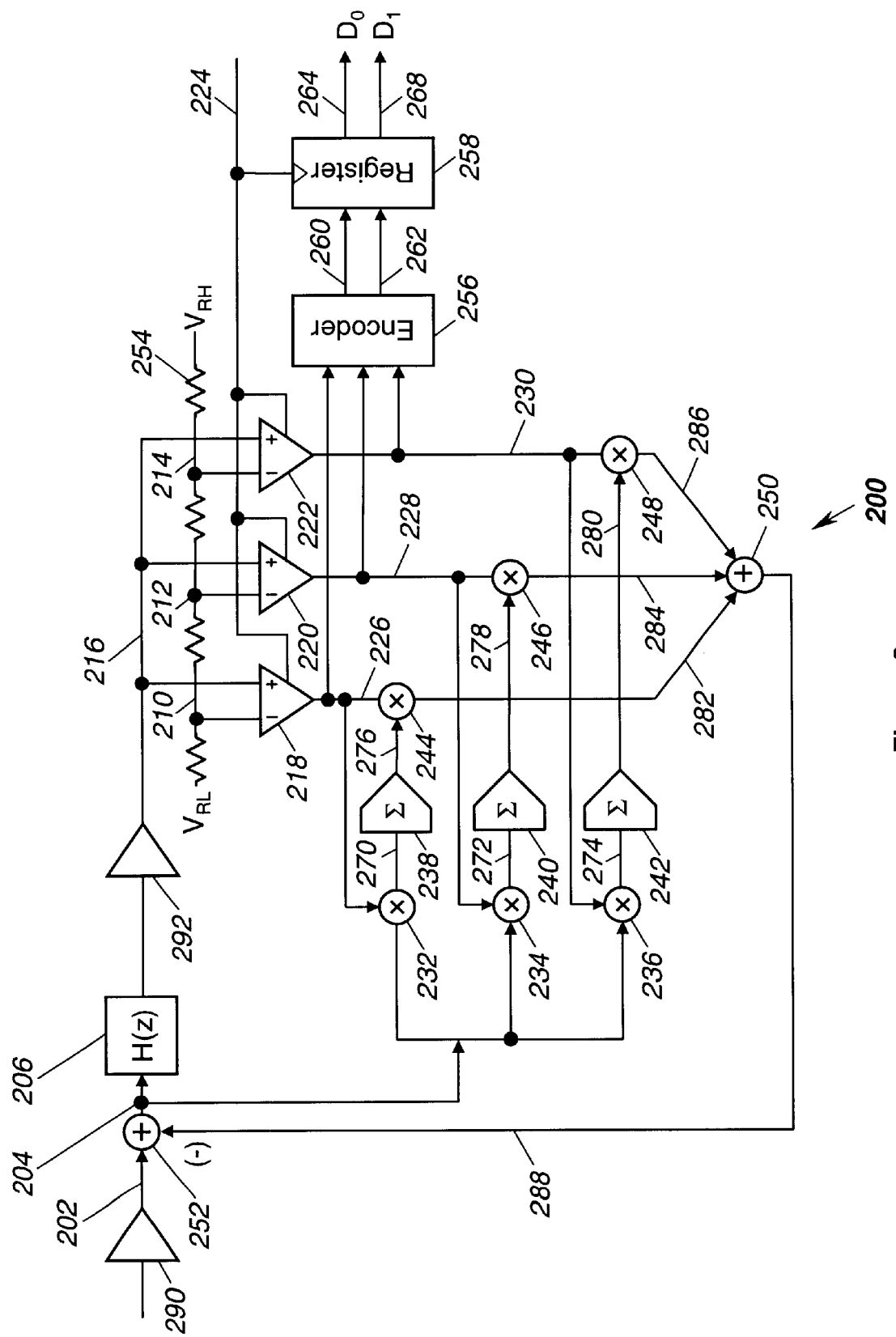
FIG. 2 is an electrical block diagram of an exemplary parallel sigma-delta A/D converter.

Referring to FIG. 2, an electrical block diagram depicts an exemplary four-level parallel sigma-delta A/D converter 200 in accordance with the present invention. While requiring a higher component count, this architecture can produce a higher linearity than the pipeline A/D converter 100 due to the use of feedback. The feedback ensures a higher level of accuracy through constant correction of the output as compared with the input signal. The adaptive compensation is viable in this parallel architecture because the adaptive tracking of each comparator is independent from that of the other comparators.

The A/D converter 200 includes a first summer 252 coupled to an analog input signal 202 and coupled to a feedback signal 288 for producing an error signal 204. The A/D converter 200 preferably also includes a conventional low-pass filter 206 coupled to the first summer 252 for producing a filtered error signal 216. Conventional amplifiers 290, 292 (optional) may also be present when needed to adjust signal levels.

The A/D converter 200 further includes a plurality of comparators 218, 220, 222 coupled to a plurality of reference voltages 210, 212, 214 formed across a series of resistors 254 coupled between low and high reference voltages $V_{RL}$ and $V_{RH}$. The plurality of comparators 218, 220, 222 are further coupled to the filtered error signal 216 for comparing the filtered error signal 216 with the plurality of reference voltages 210, 212, 214 to generate a plurality of decision signals 226, 228, 230. The plurality of comparators 218, 220, 222 are also coupled to a sample clock line 224 carrying a sample clock signal for periodically enabling the plurality of comparators 218, 220, 222 to update the plurality of decision signals 226, 228, 230.

The A/D converter 200 also includes a plurality of correlative multipliers 232, 234, 236 coupled to the summer 252 and respectively coupled to the plurality of comparators 218, 220, 222 for correlating the plurality of decision signals 226, 228, 230 with the error signal 204 to produce a plurality of correlation values 270, 272, 274. The A/D converter 200 also includes a plurality of accumulators 238, 240, 242 coupled to the plurality of correlative multipliers 232, 234, 236 for accumulating each of the plurality of correlation values 270, 272, 274 to produce a plurality of accumulated values 276, 278, 280. In addition, the A/D converter 200 includes a plurality of sign determiners 244, 246, 248 coupled to the plurality of accumulators 238, 240, 242 and coupled to the plurality of comparators 218, 220, 222 for generating a plurality of control values 282, 284, 286 whose magnitudes are determined by the plurality of accumulated values 276, 278, 280, and whose signs are determined by the plurality of decision signals 226, 228, 230

The A/D converter 200 further includes a second summer 250 for summing the plurality of control values 282, 284, 286 to generate the feedback signal 288. It will be appreciated that, alternatively, the second summer 250 can be combined with the first summer 252 by inverting the plurality of control values 282, 284, 286 to change their signs.

The A/D converter 200 also has a conventional encoder 256 coupled to the plurality of comparators 218, 220, 222 for converting the plurality of decision signals 226, 228, 230 into first and second binary signals 260, 262. The A/D converter 200 also preferably includes a conventional register 258 coupled to the encoder 256 and coupled to the sample clock line 224 for storing the first and second binary signals 260, 262 to produce first and second binary outputs 264, 268 responsive to the sample clock.

As with the A/D converter 100, the AND converter 200 can be implemented discretely using devices such as those available from Analog Devices, Inc. and described herein above. At higher operating frequencies, e.g., frequencies in the gigahertz range, the A/D converter 200 is preferably enabled to higher performance levels by implementation as an indium phosphide (InP) IC, or, alternatively, as a gallium arsenide (GaAs) IC.

Figure 3:
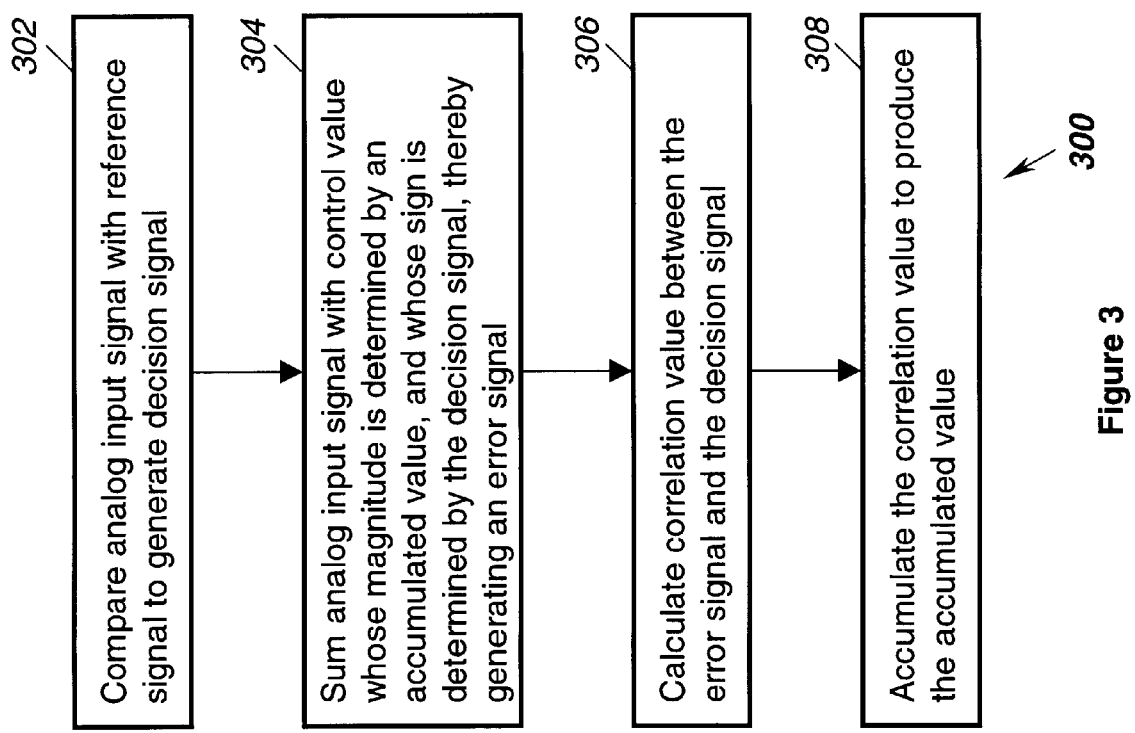
FIG. 3 is a flow diagram depicting operation of an A/D converter.

Referring to FIG. 3, a flow diagram 300 depicts operation of an A/D converter in accordance with the present invention. At 302, the analog input signal is compared with a reference signal to generate a decision signal. At 304, the analog input signal is summed with a control value whose magnitude is determined by an accumulated value, and whose sign is determined by the decision signal, thereby generating an error signal. At 306, a correlation value is then calculated between the error signal and the decision signal. This preferably is done by multiplying the error signal and the decision signal to generate a product signal. At 308, the correlation value is then accumulated in an accumulator to produce the accumulated value, thereby adaptively compensating for an inaccuracy in the AND converter. Accumulating the correlation value preferably comprises adding a predetermined portion of the product signal to the accumulated value.

In summary, in a first embodiment, the A/D converter is a pipelined converter having a plurality of stages. In the first embodiment, accumulating the correlation value involves adding a geometrically decreasing portion, e.g., decreasing by a factor of two per stage, of the product signal to the accumulated value in successive stages of decreasing bit significance. In addition, in the first embodiment, a predetermined distributed transmission delay is introduced in a path carrying the analog input signal and error signals derived from the analog input signal in the plurality of stages. A sample clock signal for reading a digital output associated with each of the plurality of stages is delayed by an amount that matches the predetermined distributed transmission delay. In the first embodiment, preferably an integrated circuit chip performs all operations without a requirement for an additional external component.

In a second embodiment the A/D converter is a parallel sigma-delta converter having a plurality of comparators. In the second embodiment, comparing the analog input signal with a reference signal involves comparing a filtered error signal derived from the analog input signal with a plurality of reference signals to generate a plurality of decision signals, and summing the analog input signal comprises summing the analog input signal with a plurality of control values whose magnitudes are determined by a plurality of accumulated values, and whose signs are determined by the plurality of decision signals, thereby generating the error signal. Also in the second embodiment, calculating the correlation value involves calculating a plurality of correlation values between the error signal and the plurality of decision signals, and accumulating the correlation value comprises accumulating each of the plurality of correlation values to produce the plurality of accumulated values, thereby adaptively compensating the inaccuracy in the A/D converter. In the second embodiment, an integrated circuit chip performs all operations without a requirement for an additional external component.

Thus, it should be clear from the preceding disclosure that the present invention provides a method and apparatus for adaptively compensating for an inaccuracy in an analog-to-digital converter. Advantageously, the method and apparatus provides compensation for quantizer gains and offsets to make them sufficiently stable over time and temperature to produce the accuracy and linearity required for multiple-carrier A/D conversion. One of ordinary skill in the art will recognize the techniques disclosed herein are general and can be implemented with many degrees of freedom. For example, the above-discussed simplified three-stage exemplary pipeline A/D converter 100 can be expanded to virtually any number of stages. The same is true for the simplified four-level exemplary parallel sigma-delta A/D converter 200, which also can be expanded without defined limits.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiments were chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method for adaptively compensating for an inaccuracy in an analog-to-digital converter, the method comprising:
   comparing an analog input signal with a reference signal to generate a decision signal;
   summing said analog input signal with a control value having a magnitude equal to an accumulated value, and having a sign determined by said decision signal, thereby generating an error signal;
   calculating a correlation value between said error signal and said decision signal, comprising multiplying said error signal and said decision signal to generate a product signal; and
   accumulating said correlation value to produce said accumulated value, comprising adding a predetermined portion of said product signal to said accumulated value, thereby adaptively compensating for said inaccuracy.

2. The method of claim 1,
   wherein the analog-to-digital converter is a pipelined converter having a plurality of stages, and
   wherein accumulating said correlation value comprises adding a geometrically decreasing portion of said product signal to said accumulated value in successive stages of decreasing bit significance.

3. The method of claim 1,
   wherein the analog-to-digital converter is a pipelined converter having a plurality of stages, and
   wherein the method further comprises:
      introducing, in a path carrying the analog input signal and error signals derived from the analog input signal in the plurality of stages, a predetermined distributed transmission delay, and
      delaying a sample clock signal for reading a digital output associated with each of the plurality of stages by an amount that matches said predetermined distributed transmission delay.

4. The method of claim 3, wherein said comparing, summing, calculating, accumulating, introducing, and delaying are performed by an integrated circuit chip without a requirement for an additional external component.

5. The method of claim 1, wherein
   the analog-to-digital converter is a parallel sigma-delta converter having a plurality of stages,
   comparing said analog input signal with a reference signal comprises comparing a filtered error signal derived from said analog input signal with a plurality of reference signals to generate a plurality of decision signals,
   summing said analog input signal comprises summing said analog input signal with a plurality of control values whose magnitudes are equal to a corresponding plurality of accumulated values, and whose signs are determined by said plurality of decision signals, thereby generating said error signal,
   calculating said correlation value comprises calculating a plurality of correlation values between said error signal and said plurality of decision signals, and
   accumulating said correlation value comprises accumulating each of said plurality of correlation values to produce said plurality of accumulated values, thereby adaptively compensating for said inaccuracy.

6. The method of claim 5, wherein said comparing, summing, calculating, and accumulating are performed by an integrated circuit chip without a requirement for an additional external component.

7. An apparatus for adaptively compensating for an inaccuracy in an analog-to-digital converter, the apparatus comprising:
   a comparator, coupled to an analog input signal and coupled to a reference signal for comparing the analog input signal with the reference signal to generate a decision signal;
   a sign determiner, coupled to said comparator and coupled to an accumulator, for generating a control value whose magnitude is an accumulated value, and whose sign is determined by said decision signal,
   a summer coupled to said analog input signal and coupled to said sign determiner for summing said analog input signal with said control value, thereby generating an error signal;
   a correlative multiplier coupled to said summer and coupled to said comparator for calculating a correlation value between said error signal and said decision signal, wherein said correlative multiplier is arranged to multiply said error signal and said decision signal to generate a product signal; and
   said accumulator coupled to said correlative multiplier for accumulating said correlation value to produce said accumulated value, wherein said accumulator is arranged to add a predetermined portion of said product signal to said accumulated value, thereby adaptively compensating for said inaccuracy.

8. The apparatus of claim 7,
   wherein the analog-to-digital converter is a pipelined converter having a plurality of stages, and
   wherein the apparatus comprises a plurality of accumulators generating a plurality of accumulated values and further comprises a plurality of correlative multipliers generating a plurality of product signals, and
   wherein said plurality of accumulators are arranged to add a geometrically decreasing portion of said plurality of product signals to said plurality of accumulated values in successive stages of decreasing bit significance.

9. The apparatus of claim 7,
   wherein the analog-to-digital converter is a pipelined converter having a plurality of stages, and
   wherein the apparatus further comprises:
      a first plurality of transmission delay lines coupled to the analog input signal and having a predetermined distributed transmission delay in a first path carrying the analog input signal and error signals derived from the analog input signal in the plurality of stages, and
      a second plurality of transmission delay lines coupled to a sample clock signal and producing a matching distributed transmission delay in a second path carrying the sample clock signal for reading a digital output associated with each of the plurality of stages.

10. The apparatus of claim 9, wherein said comparator, said sign determiner, said summer, said correlative multiplier, said accumulator, and said first and second plurality of delay lines are fabricated wholly within an integrated circuit chip.

11. The apparatus of claim 7,
wherein the analog-to-digital converter is a parallel sigma-delta converter having a plurality of stages, and
the apparatus further comprises a filter, coupled to the summer generating the error signal, for producing a filtered error signal, and wherein
the comparator is a plurality of comparators, coupled to said filtered error signal and coupled to a corresponding plurality of reference signals for comparing said filtered error signal with the plurality of reference signals to generate a plurality of decision signals,
the sign determiner is a plurality of sign determiners, coupled to said plurality of comparators and coupled to a plurality of accumulators, for generating a plurality of control values whose magnitudes are a plurality of accumulated values, and whose signs are determined by said plurality of decision signals,
the summer is coupled to said analog input signal and coupled to said plurality of sign determiners for summing said analog input signal with said plurality of control values, thereby generating said error signal,
the correlative multiplier is a plurality of correlative multipliers coupled to said summer and coupled to said plurality of comparators for calculating a plurality of correlation values between said error signal and said plurality of decision signals, and
said plurality of accumulators coupled to said plurality of correlative multipliers for accumulating said plurality of correlation values to produce said plurality of accumulated values, thereby adaptively compensating for said inaccuracy.

12. The apparatus of claim 11, wherein said summer, said filter, said plurality of comparators, said plurality of sign determiners, said plurality of correlative multipliers, and said plurality of accumulators are fabricated wholly within an integrated circuit chip.

13. An integrated circuit for adaptively compensating for an inaccuracy in an analog-to-digital converter, the integrated circuit comprising:
a comparator, coupled to an analog input signal and coupled to a reference signal for comparing the analog input signal with the reference signal to generate a decision signal;
a sign determiner, coupled to said comparator and coupled to an accumulator, for generating a control value whose magnitude is an accumulated value, and whose sign is determined by said decision signal;
a summer coupled to said analog input signal and coupled to said sign determiner for summing said analog input signal with said control value, thereby generating an error signal;
a correlative multiplier coupled to said summer and coupled to said comparator for calculating a correlation value between said error signal and said decision signal, wherein said correlative multiplier is arranged to multiply said error signal and said decision signal to generate a product signal; and
said accumulator coupled to said correlative multiplier for accumulating said correlation value to produce said accumulated value, wherein said accumulator is arranged to add a predetermined portion of said product signal to said accumulated value, thereby adaptively compensating for said inaccuracy.

14. The integrated circuit of claim 13, wherein
the analog-to-digital converter is a pipelined converter having a plurality of stages,
the integrated circuit comprises a plurality of accumulators for generating a plurality of accumulated values and further comprises a plurality of correlative multipliers for generating a plurality of product signals, and
said plurality of accumulators are arranged to add a geometrically decreasing portion of said plurality of product signals to said plurality of accumulated values in successive stages of decreasing bit significance.

15. The integrated circuit of claim 13,
wherein the analog-to-digital converter is a pipelined converter having a plurality of stages, and
wherein the integrated circuit further comprises:
a first plurality of transmission delay lines intended to be coupled to the analog input signal and having a predetermined distributed transmission delay in a first path for carrying the analog input signal and error signals derived from the analog input signal in the plurality of stages, and
a second plurality of transmission delay lines intended to be coupled to a sample clock signal and producing a matching distributed transmission delay in a second path for carrying the sample clock signal for reading a digital output associated with each of the plurality of stages.

16. The integrated circuit of claim 15, wherein said comparator, said sign determiner, said summer, said correlative multiplier, said accumulator, and said first and second plurality of delay lines are fabricated wholly within said integrated circuit without requiring an external support component.

17. The integrated circuit of claim 13,
wherein the analog-to-digital converter is a parallel sigma-delta converter having a plurality of stages, and the integrated circuit comprises a filter, coupled to said summer generating the error signal, said filter for producing a filtered error signal, and wherein
the comparator is a plurality of comparators, coupled to said filtered error signal and coupled to a corresponding plurality of reference signals for comparing said filtered error signal with the plurality of reference signals to generate a plurality of decision signals,
the sign determiner is a plurality of sign determiners, coupled to said plurality of comparators and coupled to a plurality of accumulators, for generating a plurality of control values having magnitudes equal to a plurality of accumulated values, and having signs determined by said plurality of decision signals,
said summer is coupled to said analog input signal and coupled to said plurality of sign determiners for summing said analog input signal with said plurality of control values, thereby generating error the signal,
the correlative multiplier is a plurality of correlative multipliers coupled to said summer and coupled to said plurality of comparators for calculating a plurality of correlation values between said error signal and said plurality of decision signals, and
said plurality of accumulators coupled to said plurality of correlative multipliers for accumulating said plurality of correlation values to produce said plurality of accumulated values, thereby adaptively compensating for said inaccuracy.

18. The integrated circuit of claim 17, wherein said summer, said filter, said plurality of comparators, said plurality of sign determiners, said plurality of correlative multipliers, and said plurality of accumulators are fabricated wholly within an integrated circuit chip without requiring an external support component.

* * * * *